(12) United States Patent
Okada

(10) Patent No.: US 7,939,927 B2
(45) Date of Patent: May 10, 2011

(54) SEMICONDUCTOR MEMORY APPARATUS

(75) Inventor: Takashi Okada, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 199 days.

(21) Appl. No.: 12/396,017

(22) Filed: Mar. 2, 2009

(65) Prior Publication Data

US 2009/0230534 A1  Sep. 17, 2009

(30) Foreign Application Priority Data

Feb. 29, 2008  (JP) ................. 2008-049712

(51) Int. Cl.
*H01L 25/065* (2006.01)
*H01L 23/48* (2006.01)

(52) U.S. Cl. ............... 257/686; 257/777; 257/E23.01

(58) Field of Classification Search ............ 257/686, 257/777, 690, E25.013, E23.01
See application file for complete search history.

(56) References Cited

U.S. PATENT DOCUMENTS

| | | | | |
|---|---|---|---|---|
| 5,563,086 A | * | 10/1996 | Bertin et al. | ............ 438/15 |
| 2005/0116331 A1 | | 6/2005 | Tsunozaki | |
| 2006/0091518 A1 | | 5/2006 | Grafe et al. | |

FOREIGN PATENT DOCUMENTS

JP    2007-128953    5/2007

OTHER PUBLICATIONS

U.S. Appl. No. 12/343,921, filed Dec. 24, 2008, Taku Nishiyama, et al.
U.S. Appl. No. 12/238,983, filed Sep. 26, 2008, Taku Nishiyama, et al.

* cited by examiner

*Primary Examiner* — Roy K Potter
(74) *Attorney, Agent, or Firm* — Oblon, Spivak, McClelland, Maier & Neustadt, L.L.P.

(57) ABSTRACT

The semiconductor memory apparatus related to an embodiment of the present invention includes a wiring substrate arranged with a device mounting part and connection pads aligned along one exterior side of the wiring substrate, a plurality of semiconductor memory devices including electrode pads which are arranged along one external side of the wiring substrate, a semiconductor memory device group in which the plurality of semiconductor memory devices are stacked on the device mounting part of the wiring substrate so that pad arrangement sides all face in the same direction, and a controller device including the electrode pads arranged along at least one external side of the wiring substrate, wherein the electrode pads of the plurality of semiconductor memory devices and the electrode pads of the controller device are arranged parallel to an arrangement position of the connection pads of the wiring substrate.

12 Claims, 6 Drawing Sheets

SEMICONDUCTOR MEMORY APPARATUS

CROSS REFERENCE TO RELATED APPLICATION

This application is based upon and claims the benefit of priority from the prior Japanese Patent Application No. 2008-49712, filed on Feb. 29, 2008, the entire contents of which are incorporated herein by reference.

BACKGROUND OF THE INVENTION

1. Field of the Invention

The present invention is related to a semiconductor memory apparatus and in particular a semiconductor memory apparatus arranged with a plurality of semiconductor memory devices.

2. Description of the Related Art

The development of small scale and large capacity is progressing in memory cards with, for example, an internally mounted NAND type flash memory. For example, the card size of an SD™ memory card has three size types, usual SD™ card size, mini SD™ card size and micro SD™ card size, and large capacity is progressing even in the Micro™ SD card. In order to realize a small scale memory card, semiconductor device such as memory device and controller device are mounted in the memory card by stacking on a wiring substrate. An electrode pad of a semiconductor device is electrically connected to connection pads of the wiring substrate using wire bonding. Furthermore, in order to achieve a memory card with large capacity the memory devices themselves are stacked in multi-layers on a wiring substrate.

For example, in the memory card described in Japan Laid Open Patent 20007-128953 a plurality of memory devices arranged with a plurality of electrode pads which are formed almost in a line along one side of the memory card, are stacked on a wiring substrate and the plurality of electrode pads and connection pads of the wiring substrate are connected via bonding wire. A controller device is stacked on the stacked memory device and electrode pads of the controller device are connected with the connection pads of the wiring substrate via wire bonding. The controller device is elongated in shape and is smaller in size than the memory device and arranged so that the long side of the controller device is parallel to a direction of applied ultrasound during bonding.

BRIEF SUMMARY OF THE INVENTION

The semiconductor memory apparatus related to embodiments of the present invention is arranged with a wiring substrate arranged with a device mounting part and connection pads aligned along one exterior side of the wiring substrate, a semiconductor memory device group arranged with a plurality of semiconductor memory devices including electrode pads which are arranged along one external side of the wiring substrate, the plurality of semiconductor memory devices being stacked on the device mounting part of the wiring substrate so that pad arrangement sides all face in the same direction, a controller device including the electrode pads arranged along at least one external side of the wiring substrate, and stacked on the semiconductor memory device group, a first metallic wire which electrically connects the electrode pads of the plurality of semiconductor memory devices with the connection pads of the wiring substrate, a second metallic wire which electrically connects the electrode pads of the controller device with the connection pads of the wiring substrate, and a third metallic wire which electrically connects the electrode pads of the plurality of semiconductor memory devices with the electrode pads of the controller device, wherein the electrode pads of the plurality of semiconductor memory devices and the electrode pads of the controller device are arranged parallel to an arrangement position of the connection pads of the wiring substrate.

The semiconductor memory apparatus related to embodiments of the present invention is arranged with a wiring substrate arranged with a device mounting part and connection pads aligned along at least two exterior sides of the wiring substrate, a first device group arranged with a plurality of semiconductor devices which include electrode pads aligned along one external side of the wiring substrate, the plurality of semiconductor devices being stacked on the device mounting part of the wiring substrate so that pad arrangement sides all face in the same direction, a second device group arranged with a plurality of semiconductor devices which include electrode pads aligned along the other external side of the wiring substrate, the plurality of semiconductor devices being stacked on the device mounting part of the wiring substrate so that pad arrangement sides all face in the same direction, a controller device including the electrode pads arranged along at least one external side of the wiring substrate, the controller device being stacked on the second device group, a first metallic wire which electrically connects the electrode pads of the plurality of semiconductor memory devices which includes the first device group, with the connection pads of the wiring substrate, a second metallic wire which electrically connects the electrode pads of the plurality of semiconductor memory devices which includes the second device group, with the connection pads of the wiring substrate, and a third metallic wire which electrically connects the electrode pads of the controller device with the connection pads of the wiring substrate wherein the plurality of semiconductor memory devices which includes the first device group and the plurality of semiconductor memory devices which includes the second device group are alternately stacked so that the electrode pads alternately protrude, and the electrode pads of the plurality of semiconductor memory devices and the electrode pads of the controller device are arranged parallel to an arrangement position of the connection pads of the wiring substrate.

DETAILED DESCRIPTION OF THE INVENTION

The embodiments of the present invention will be explained below while referring to the diagrams. The semiconductor memory apparatus related to the embodiments is explained using a micro SD™ card as an example. Furthermore, in the embodiments, the same structural parts have the same symbols and therefore to avoid repetition between embodiments a number of explanations are omitted.

First Embodiment

Figure 1:
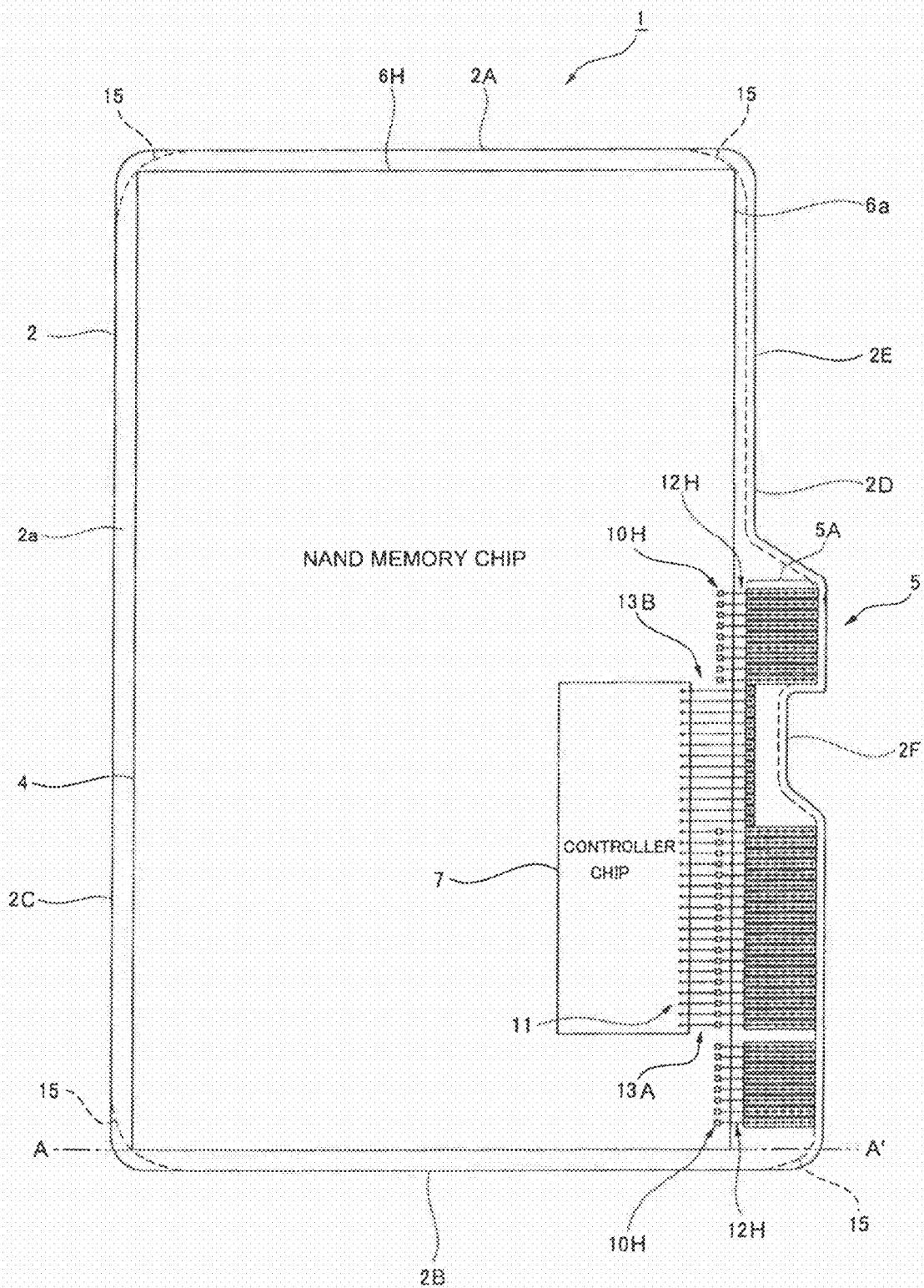
FIG. 1 is a planar view diagram which shows a construction of a micro SD™ card related to the first embodiment of the present invention.
Figure 2:
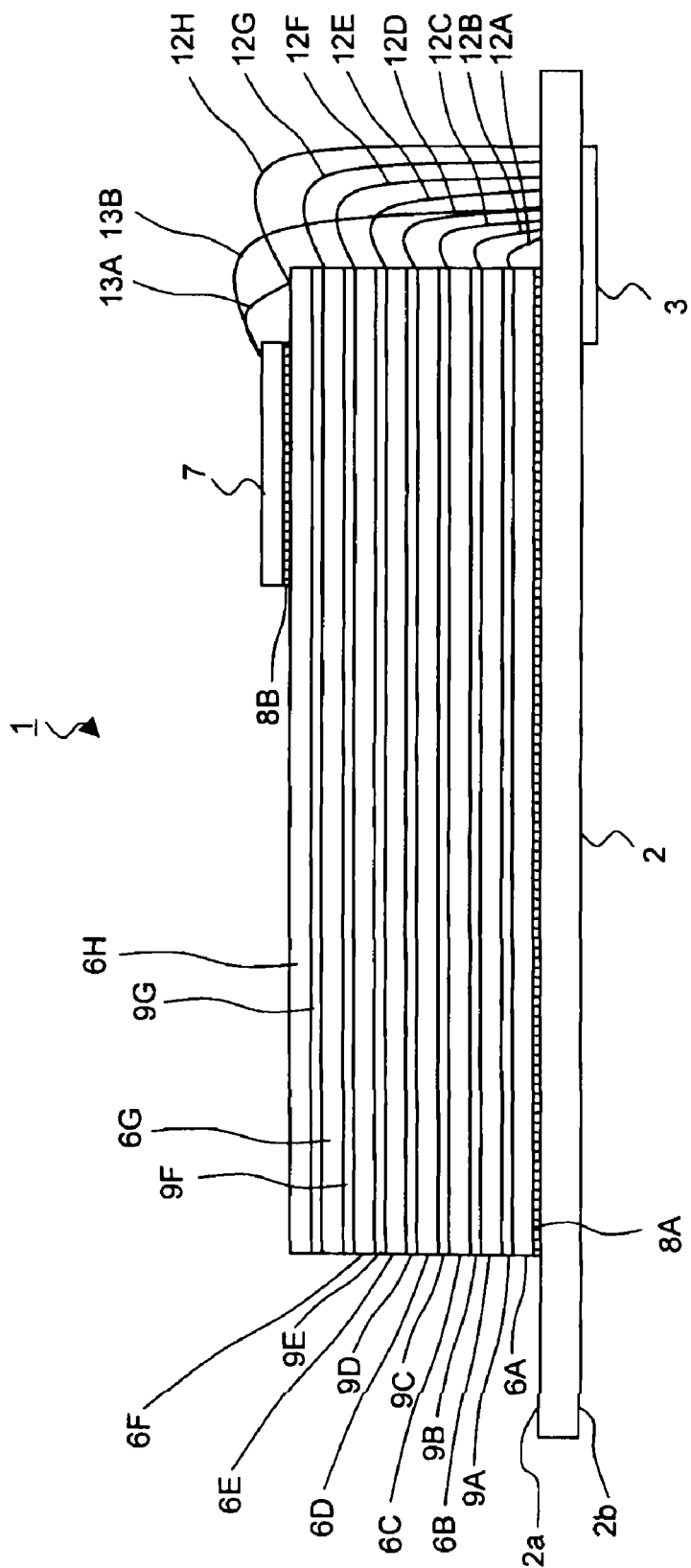
FIG. 2 is a side view diagram along the line A-A' in FIG. 1 of the micro SD™ card related to the first embodiment of the present invention.

FIG. 1 is a planar view diagram which shows a construction of a micro SD™ card related to the first embodiment. FIG. 2 is a side view diagram along the line A-A' in FIG. 1. In FIG. 1, the micro SD™ card 1 is arranged with a wiring substrate 2 which combines a device mounting substrate with a terminal formation substrate. The wiring substrate 2 is a substrate in which the interior and surfaces of an insulation resin substrate are arranged with a wiring network. More specifically, a printed wiring substrate which uses a glass-epoxy resin or bismaleimide triazine resin is applied. The wiring substrate 2 is arranged with a first main side which becomes a device mounting side and a second main side which becomes a terminal formation side.

The wiring substrate 2 includes a roughly rectangular exterior. One of the short sides 2A of the wiring substrate 2 is equivalent to a tip end part when the micro SD™ card 1 is inserted into a card slot of an electronic apparatus. The other shorter end 2B is equivalent to the posterior part of the micro SD™ card 1. One of the longer sides 2C of the wiring substrate 2 has a linear shape. A notch part 2E and a constriction part 2F showing the direction of the front and back and top and bottom of the micro SD™ card 1 are formed on the other longer side 2D of the wiring substrate 2.

An external connection terminal 3 which becomes an input/output terminal of the micro SD™ card 1 is formed on the second main side 2b of the wiring substrate 2. The external connection terminal 3 is formed by a metal layer which is formed by electrolyte plating for example. Furthermore, the second main side 2b of the wiring substrate 2 is equivalent to the top surface of the micro SD™ card 1.

A device mounting part 4 and connection pads 5 which become a bonding part during wire bonding are formed on the first main side 2a of the wiring substrate 2. Furthermore, the first main side 2a of the wiring substrate 2 is equivalent to the bottom side of the micro SD™ card 1. The connection pads 5 are electrically connected with the external connection terminal 3 via internal wiring (through holes etc) which is omitted from the diagram of the wiring substrate 2. The connection pads 5 are arranged on a pad region 5A which runs along the long side 2D of the wiring substrate 2.

A plurality of NAND memory chips (semiconductor memory devices) 6A-6H are mounted and stacked on the device mounting part 4 of the first main side 2a of the wiring substrate 2. A controller chip 7 (controller device) is stacked on the NAND memory chip 6H. The controller chip 7 selects the NAND flash memory chips 6 which perform programming and reading of data among the plurality of NAND memory chips 6A-6H, performs programming of data to the selected NAND memory chip 6 and reads data stored in the selected NAND memory chip 6.

As is shown in FIG. 2, the NAND memory chips 6A-6H are stacked in eight stages in order from the bottom on the first main side 2a of the wiring substrate 2. The NAND memory chip 6A is attached to the device mounting part 4 of the wiring substrate 2 via a die attach film 8A arranged on the bottom surface side of the NAND memory chip 6A. The NAND memory chips 6B to 6H are attached to each upper surface (stacking surface) of the NAND memory chips 6A to 6G on lower layers via hollow films 9A-9G. Furthermore, the number of stacked layers of the NAND memory chip 6 is shown as eight in the first embodiment. However, the number of stacked layers is not particularly limited.

The die attach film 8 is an attach film which possesses the function of a dicing tape and a bonding agent. A material which uses a resin such as a general polyimide resin, an epoxy resin and acrylic resin as its main component is used in this die adhesive layer. The die attach film 8A uses a material which has the same rectangular shape as the exterior of the NAND memory chips 6A-6H.

The hollow films 9A-9G are stacked on each upper surface of the NAND memory chips 6A-6G. The hollow films 9A-9G use a material which has a resin etc as its main component. The hollow films 9A-9G are arranged so that electrode pads 10A-10G described below and which are arranged on each upper surface (stacking surface) of the NAND memory chips 6A-6G, and bonding wires 12A-12G which are connected to the electrode pads 10A-10G, are buried within the resin. The hollow films 9A-9G use a material which has the same rectangular shape as the exterior of the NAND memory chips 6A-6H.

The NAND memory chips 6A-6H have the same rectangular shape and the electrode pads 10A-10H are arranged on the upper surface of each chip. In FIG. 1, only the electrode pad 10H is shown which is arranged on the upper surface of the NAND memory chip 6H which is stacked on the uppermost layer. The other electrode pads 10A-10G are omitted from the diagram. The electrode pad 10H is arranged in one line along the exterior side (longer side 6a shown in FIG. 1) of the NAND memory chip 6H. Similarly, the electrode pads 10A-10G of the other NAND memory chips 6A-6G are also arranged in one line along the exterior side (not shown in the diagram) of each NAND memory chip 6A-6G. In addition, the electrode pads 10A-10H are arranged parallel to an arrangement position of the connection pads 5 which are arranged on the first main side 2a of the wiring substrate 2. Furthermore, in the present embodiment, the sides of the electrode pads 10A-10H of the NAND memory chips 6A-6H which are arranged are called pad arrangement sides.

The controller chip 7 is attached to the upper surface of the NAND memory chip 6H via a die attach film 8B. The die attach film 8B has the same rectangular shape as the exterior of the controller chip 7. The controller chip 7 is arranged with electrode pads 11 on its upper surface. The electrode pads 11 are arranged along an exterior side (longer side shown in FIG. 1) of the controller 7. In addition, the electrode pads 11 are directly connected to the connection pads 5 of the wiring substrate 2 and also connected to the connection pads 5 of the wiring substrate 2 via the electrode pads 10H of the NAND memory chip 6H. Furthermore, the electrode pads 11 of the controller chip 7 are arranged in parallel to an arrangement position of the electrode pads 10 of the NAND memory chip 6H, and parallel to an arrangement position of the connection pads 5 of the wiring substrate 2.

The connection pads 5 of the wiring substrate 2 are arranged along an exterior side (longer side 2D in FIG. 1) of the first main side 2a. In the wiring substrate 2, the connection pads 5 which are directly connected with the electrode pads 10A-10G of the NAND memory chips 6A-6G are arranged further to the exterior of a notch part 2E and a constriction part 2F, and the connection pads 5 which are directly connected with the electrode pads 11 of the controller chip 7 are arranged on the constriction part 2F.

The electrode pads 10H of the NAND memory chip 6H are electrically connected with the connection pads 5 of the wiring substrate 2 via a bonding wire 12H (first metallic wire). Similarly, the electrode pads 10A-10G of the NAND memory chips 6A-6G are electrically connected with the connection pads 5 of the wiring substrate 2 via bonding wires 12A-12G (first metallic wire). The electrode pads 11 of the controller chip 7 are electrically connected with the electrode pads 10H of the NAND memory chip 6H via a bonding wire 13A (third metallic wire) and electrically connected with the connection pads 5 of the wiring substrate 2 via a bonding wire 13B (second metallic wire).

As described above, a plurality of NAND memory chips 6A-6H including electrode pads 10A-10H which are arranged in a line along the longer side 2D of the wiring substrate 2 are arranged in the micro SD™ card 1 shown in FIG. 1. In addition, the plurality of NAND memory chips 6A-6H are stacked so that the arrangement sides (pad arrangement sides) of the electrode pads 10A-10H on the device mounting part 4 of the first main side 2a of the wiring substrate face the same direction. The controller 7 is stacked on the stacking surface of the NAND memory chip 6H. The controller 7 includes at least electrode pads 11 which are arranged in a line along the longer side 2D of the wiring substrate 2. In addition, the electrode pads 10A-10H of the NAND memory chips 6A-6H and the electrode pads 11 of the controller 7 are arranged parallel to an arrangement position of the connection pads 5 of the first main side 2a of the wiring substrate 2.

The plurality of connection pads 5 arranged on the first main side 2a of the wiring substrate 2 are arranged along the longer side 2D. The connection pads 5 which are directly connected with the electrode pads 10A-10H of the NAND memory chips 6A-6H, and the connection pads 5 which are connected with the electrodes 11 of the controller chip 7 via the electrode pads 10H of the NAND memory chip 6H, are arranged further to the exterior of the notch part 2E and the constriction part 2F of the wiring substrate 2. The connection pads 5 which are directly connected with the electrode pads 11 of the controller chip 7 are arranged in the constriction part 2F of the wiring substrate.

Furthermore, hollow films 9A-9G are stacked on a stacking surface of each NAND memory chip 6A-6G and between the NAND memory chips 6A-6H. The die attach film 8A and the hollow films 9A-9G use a material which has the same external rectangular shape as the NAND memory chips 6A-6H. As a result, the connection terminal parts of the bonding wires 12A-12G which electrically connect the electrode pads 10A-10G of the NAND memory chips 6A-6G and the connection pads 5 of the wiring substrate 2 can be buried in the substrate. As a result, steps in which the electrode pads 10A-10G of the NAND memory chips 6A-6G protrude are not arranged and it is possible to stack (the NAND memory chips 6A-6G) in a perpendicular direction and make each external side of the NAND memory chips 6A-6H uniform.

Because the micro SD™ card 1 is formed as described above, it becomes possible to stack the NAND memory chips 6A-6H which have the largest exterior within the parts arrangement limit position 15 on the first main side 2a of the wiring substrate 2 shown in FIG. 1. As a result, it becomes possible to increase the capacity of a NAND memory chip within the exterior dimensions (L: 15.0 mm, W: 11.0 mm, T: 1.0 mm) of the micro SD™ card 1.

Second Embodiment

In the second embodiment, an example structure of a micro SD™ card will be explained in which the hollow films 9A-9G used in the above described first embodiment are not required and the number of NAND memory chip layers is further increased.

Figure 3:
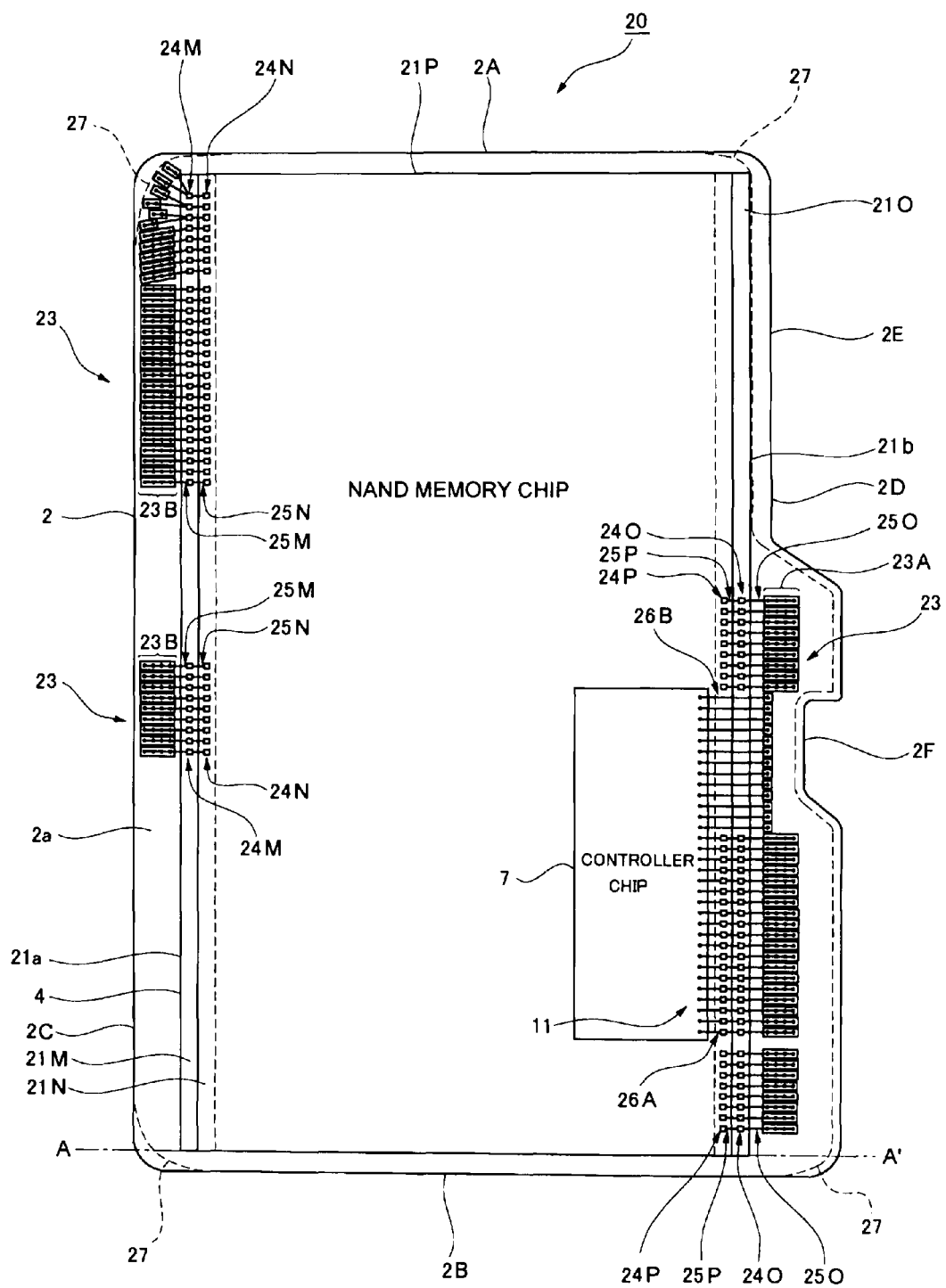
FIG. 3 is a planar view diagram which shows a construction of a micro SD™ card related to the second embodiment of the present invention.
Figure 4:
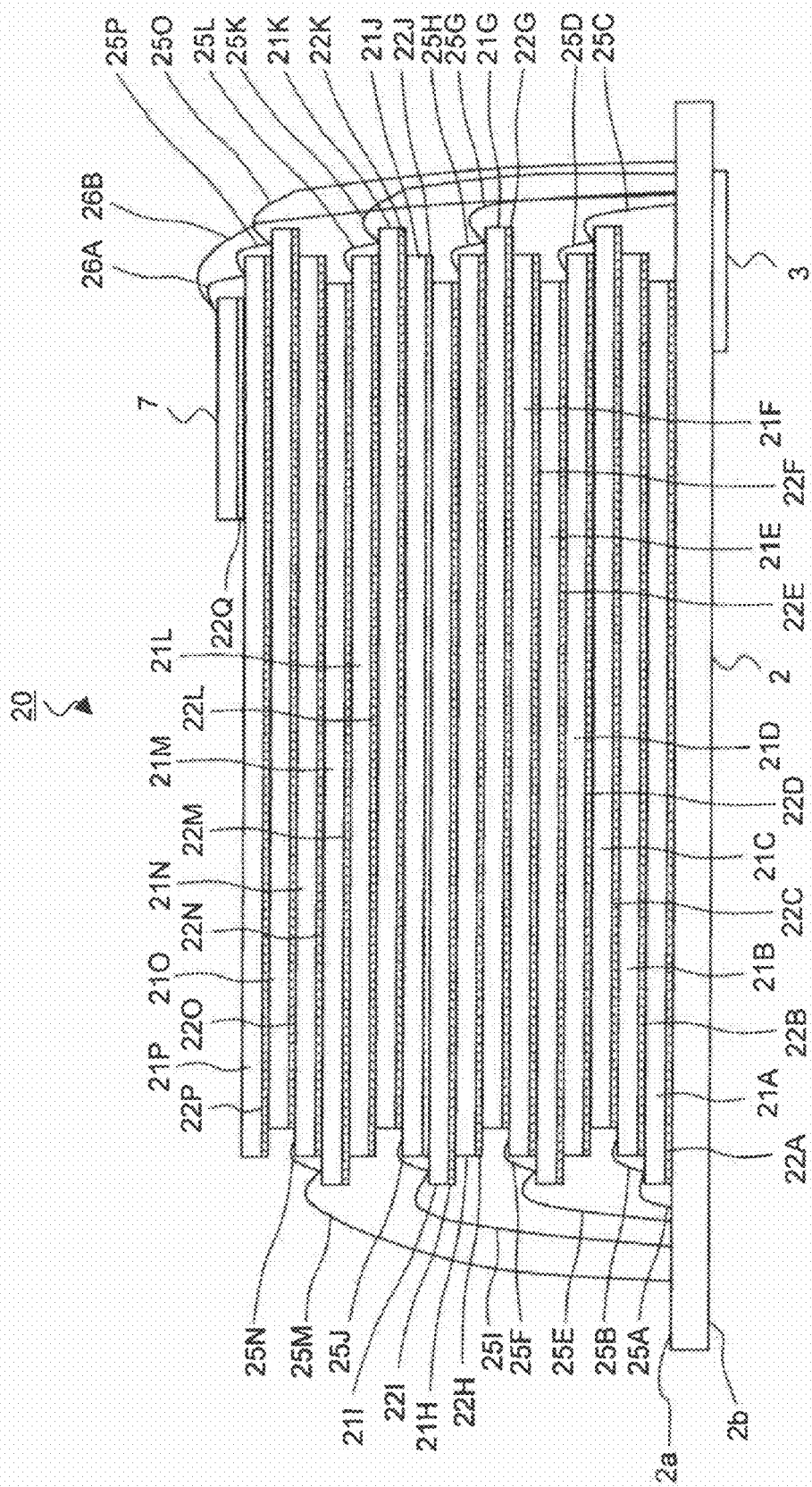
FIG. 4 is a side view diagram along the line A-A' in FIG. 3 of the micro SD™ card related to the second embodiment of the present invention.

The micro SD™ card related to the second embodiment will be explained while referring to FIG. 3 and FIG. 4. FIG. 3 is a planar view diagram which shows the structure of a micro SD™ card 20 related to the second embodiment. FIG. 4 is a side view diagram along the line A-A' in FIG. 3. Furthermore, in FIG. 3 and FIG. 4, the same symbols are attached to the same structural parts as the micro SD™ card shown in FIG. 1 and FIG. 2 and therefore an explanation of these structural parts will be omitted.

Device mounting part 4 and connection pads 23 which become bonding parts during wire bonding are formed on the first main side 2a of the wiring substrate 2. Furthermore, the first main side 2a of the wiring substrate 2 is equivalent to the under side of the micro SD™ card 1. The connection pads 23 are electrically connected with external connection terminals 3 via internal wiring (through holes etc), which are omitted from the diagram of the wiring substrate 2. The connection pads 23 are arranged in pad regions 23A and 23B along the external longer sides 2C and 2D of the wiring substrate 2.

A plurality of semiconductor memory devices 21A-21P are stacked and mounted on the device mounting part 4 of the first main side 2a of the wiring substrate 2. A controller chip 7 (controller device) is stacked on the NAND memory chip 21P. The controller chip 7 selects the NAND memory chips 21 which perform programming and reading of data among the plurality of NAND memory chips 21A-21P, performs programming of data to the selected NAND memory chip 21 or performs reading of data stored in the selected NAND memory chip 21.

As is shown in FIG. 4, the NAND memory chips 21A-21P are stacked in sixteen steps in order from the bottom on the first main side 2a of the wiring substrate 2. The NAND memory chip 21A is attached to device mounting part 4 of the wiring substrate 2 via a die attach film 22A which is formed on the bottom surface side of the NAND memory chip 21A. The NAND memory chips 21A-21P are attached to each top surface (stacking surface) of the NAND memory chips 21A-21P on lower layers via die attach films 22B-22P. Furthermore, the number of stacked layers of the NAND memory chips 21 is shown as sixteen steps in the second embodiment, however, the number of stack layers is not limited to this.

The die attach films 22A-22P are adhesive films which possess both dicing tape and bonding adhesive functions. A material which uses a resin such as a general polyimide resin, an epoxy resin and acrylic resin as its main component is used in these adhesive layers. The die attach films 22A-22P use a material which has the same rectangular shape as the exterior of the NAND memory chips 21A-21P.

The NAND memory chips 21A-21P have the same rectangular shape and electrode pads 24A-24P are arranged on the upper surface of each chip. In FIG. 3, only the electrode pad 24P which is arranged on the upper surface of the NAND memory chip 21P which is stacked on the uppermost layer, and the electrode pads 24M-24P which are arranged on each upper surface of the NAND memory chips 21M-21O which are stacked on the lower layers, are shown. The other electrode pads 24A-24L are omitted from the diagram. The NAND memory chips 21A-21P are stacked in steps so that each electrode pad 24A-24P protrudes alternately.

The electrode pads 24A, 24B, 24E, 24F, 24I, 24J, 24M and 24N of the NAND memory chips 21A, 21B, 21E, 21F, 21I, 21J, 21M and 21N are arranged in one line along the exterior side (longer side 21a shown in FIG. 3) of the NAND memory chip 21P. Similarly, the electrode pads 24C, 24D, 24G, 24H, 24K, 24L, 24O and 24P of the NAND memory chips 21C, 21D, 21G, 21H, 21K, 21L, 21O and 21P are arranged in one line along the exterior side (longer side 21*b* shown in the FIG. 3) of the NAND memory chip 21P.

In addition, the electrode pads 24C, 24D, 24G, 24H, 24K, 24L, 24O and 24P are arranged parallel to an arrangement position of the pad region 23A of the connection pads 23 which are arranged on the first main side 2*a* of the wiring substrate 2. The electrode pads 24A, 24B, 24E, 24F, 24I, 24J, 24M and 24N are arranged parallel to an arrangement position of the pad region 23*b* of the connection pads 23 which are arranged on the first main side 2*a* of the wiring substrate 2. Furthermore, in the present embodiment, each side of the electrode pads 24A-24P of the NAND memory chips 21A-21P which are arranged are called pad arrangement sides.

The controller chip 7 is attached to the upper surface of the NAND memory chip 21P by a die attach film 22Q. The die attach film 22Q has the same rectangular shape as the exterior of the controller chip 7. The controller chip 7 is arranged with electrode pads 11 on its upper surface. The electrode pads 11 are arranged along an exterior side (longer side shown in FIG. 3) of the controller chip 7. In addition, the electrode pads 11 are directly connected to the connection pads 23 of the wiring substrate 2 and also connected to the connection pads 23 of the wiring substrate 2 via the electrode pad 24P of the NAND memory chip 21P. Furthermore, the electrode pads 11 of the controller chip 7 are arranged parallel to an arrangement position of the electrode pads 24P of the NAND memory chip 21P, and parallel to an arrangement position of the connection pads 5 of the wiring substrate 2.

The connection pads 23 of the wiring substrate 2 are arranged along the two exterior sides (the longer sides 2C, 2D shown in FIG. 3) on the first main side 2*a*. In the wiring substrate 2, the connection pads 23 which are directly connected with the electrode pads 24C, 24D, 24G, 24H, 24K, 24L, 24O and 24P of the NAND memory chips 21C, 21D, 21G, 21H, 21K, 21L, 21O and 21P are arranged further to the exterior of a notch part 2E and a constriction part 2F, and the connection pads 23 which are directly connected with the electrode pads 11 of the controller chip 7 are arranged on the constriction part 2F. In addition, in the wiring substrate 2, the connection pads 23 which are directly connected with the electrode pads 24A, 24B, 24E, 24F, 24I, 24J, 24M and 24N of the NAND memory chips 21A, 21B, 21E, 21F, 21I, 21J, 21M and 21N are arranged along one exterior side (longer side 2C shown in FIG. 3) of the first main side 2*a*.

As is shown in FIG. 3, the electrode pads 24O and 24P of the NAND memory chips 21O and 21P are electrically connected with the connection pads 23 of the wiring substrate 2 via bonding wires 25O and 25P (first metallic wire). As is shown in FIG. 4, the electrode pads 24C, 24D, 24G, 24H, 24K and 24L of the NAND memory chips 21C, 21D, 21G, 21H, 21K and 21L are electrically connected with the connection pads 23 of the wiring substrate 2 via bonding wires 25C, 25D, 25G, 25H, 25K and 25L (first metallic wire).

In addition, as is shown in FIG. 3, the electrode pads 24M, 24N of the NAND memory chips 21M and 21N are electrically connected with the connection pads 23 of the wiring substrate 2 via bonding wires 25M and 25N (first metallic wire). As is shown in FIG. 4, the electrode pads 24A, 24B, 24E, 24F, 24I and 24J of the NAND memory chips 21A, 21B, 21E, 21F, 21I and 21J are electrically connected with the connection pads 23 of the wiring substrate 2 via bonding wires 25A, 25B, 25E, 25F, 25I and 25J (first metallic wire).

The electrode pads 11 of the controller chip 7 are electrically connected with the electrode pad 24P of the NAND memory chip 21P via a bonding wire 26A (third metallic wire) and electrically connected with the connection pads 23 of the wiring substrate 2 via a bonding wire 26B (second metallic wire).

As stated above, the micro SD™ card 20 shown in FIG. 3 is arranged with a plurality of memory chips 21A-21P which include electrode pads 24A-24P arranged in a line along the longer sides 2C, 2D of the wiring substrate 2. In addition, the plurality of NAND memory chips 21C, 21D, 21G, 21H, 21K, 21L, 21O and 21P (first device group), are stacked on the device mounting part 4 of the first main side 2*a* of the wiring substrate 2 so that the arrangement sides (pad arrangement sides) of the electrode pads 24C, 24D, 24G, 24H, 24K, 24L, 24O and 24P face in the same direction. The controller chip 7 is stacked on the stacking surface of the NAND memory chip 21P. The controller chip 7 includes electrode pads 11 which are arranged in a line along at least the longer side 2D of the wiring substrate 2. In addition, the electrode pads 24C, 24D, 24G, 24H, 24K, 24L, 24O, 24P of the NAND memory chips 21C, 21D, 21G, 21H, 21K, 21L, 21O, 21P, and the electrode pads 11 of the controller chip 7 are arranged parallel to an arrangement position of the connection pads 23 of the first main side 2*a* of the wiring substrate 2.

In addition, the plurality of NAND memory chips 21A, 21B, 21E, 21F, 21I, 21J, 21M, 21N (second device group) are stacked on the device mounting part 4 of the first main side 2*a* of the wiring substrate 2 so that the arrangement sides (pad arrangement sides) of the electrode pads 24A, 24B, 24E, 24F, 24I, 24J, 24M and 24N face in the same direction. Furthermore, the NAND memory chips 21C, 21D, 21G, 21H, 21K, 21L, 21O and 21P (first device group) and the NAND memory chips 21A, 21B, 21E, 21F, 21I, 21J, 21M, 21N (second device group) are stacked in steps so that each electrode pad 24A-24P protrudes alternately.

The connection pads 23 of the wiring substrate 2 are arranged along the two external sides (the longer sides 2C, 2D shown in FIG. 3) on the first main side 2*a*. In the wiring substrate 2, the connection pads 23 which are directly connected with the electrode pads 24C, 24D, 24G, 24H, 24K, 24L, 24O and 24P of the NAND memory chips 21C, 21D, 21G, 21H, 21K, 21L, 21O and 21P are arranged further to the exterior of a notch part 2E and a constriction part 2F, and the connection pads 23 which are directly connected with the electrode pads 11 of the controller chip 7 are arranged on the constriction part 2F.

Furthermore, die attach films 22A-22P are stacked on a stacking surface of each NAND memory chips 21A-21P and between the NAND memory chips 21A-21P. The die attach films 22A-22P use a material which has the same external rectangular shape as the NAND memory chips 21A-21P. As a result, because hollow films 9A-9G such as those of the micro SD™ card 1 shown in the first embodiment are not used, it is not possible to stack the upper layer NAND memory chips on the electrode pads 24A-22P part and thus it is necessary to slightly adjust the stacking position of the NAND memory chips in a horizontal direction before stacking.

In addition, because the NAND memory chips 21A-21P are stacked so that the electrode pads 24A-24P parts protrude, it is necessary to arrange the electrode pads 24A-24P along each longer side 21*a*, 21*b* of the NAND memory chips 21A-21P. As a result, the size of the NAND memory chips 21A-21P is restricted by the electrode pads 24A-24P which are arranged further inwards than the parts arrangement position shown in FIG. 3. That is, the size of the NAND memory chips 21A-21P become smaller than the size of the NAND memory chips 6A-6H mounted on the micro SD™ card 1 shown in the first embodiment.

However, a pair of adjacent NAND memory chips 21A-21P are connected by bonding wires 25B, 25D, 25F, 25H, 25J, 25L, 25N, 25P (fourth metallic wire) and the electrode pads 24A-24P of the NAND memory chips 21A-21P are connected to the connection pads 23 on the wiring substrate 2 by the bonding wires 25A, 25C, 25E, 25G, 25I, 25K, 25O. As a result, even if there are a large number of stacked layers of NAND memory chips, it is not necessary to enlarge the pad regions 23A, 23B on the wiring substrate 2. Therefore, in the micro SD™ card 20 shown in the second embodiment, the size of a mountable NAND memory chip becomes smaller than in the micro SD™ card 1 shown in the first embodiment, however, because it is was made unnecessary to stack the hollow films by adjusting the arrangement of a pad for bonding, it is possible to easily increase the number of stacked layers of NAND memory chips. As a result, it becomes possible to further increase the capacity of NAND memory chips within the external dimensions (L: 15.0 mm, W: 11.0 mm, T: 1.0 mm) of the micro SD™ card 1.

Furthermore, the present invention was applied to a micro SD™ card in the first and second embodiment. However, the present invention is not limited to this. The present invention can be applied to various semiconductor memory apparatus which include a plurality of mounted and stacked semiconductor memory device on a wiring substrate.

Third Embodiment

In the third embodiment of this invention, the hollow films 9A-9G used in the first embodiment stated above are not required, and an example construction of the micro SD™ card in which the placement of the bonding wire which is matched to the shape of the substrate, and the placement of the chip parts in the non-mounting region of the memory chip is made possible, will be explained.

Figure 5:
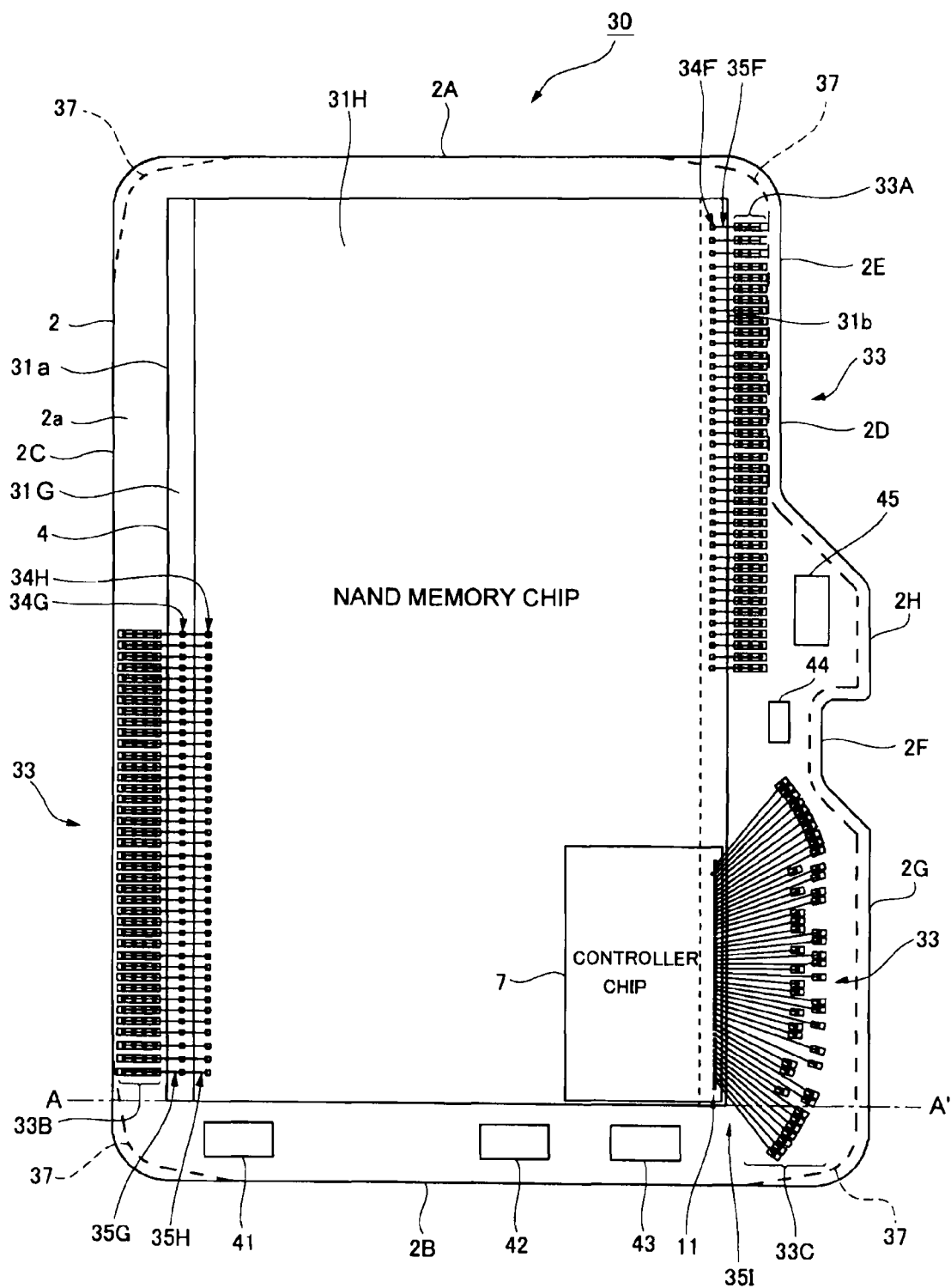
FIG. 5 is a planar view diagram which shows a construction of a micro SD™ card related to the third embodiment of the present invention.
Figure 6:
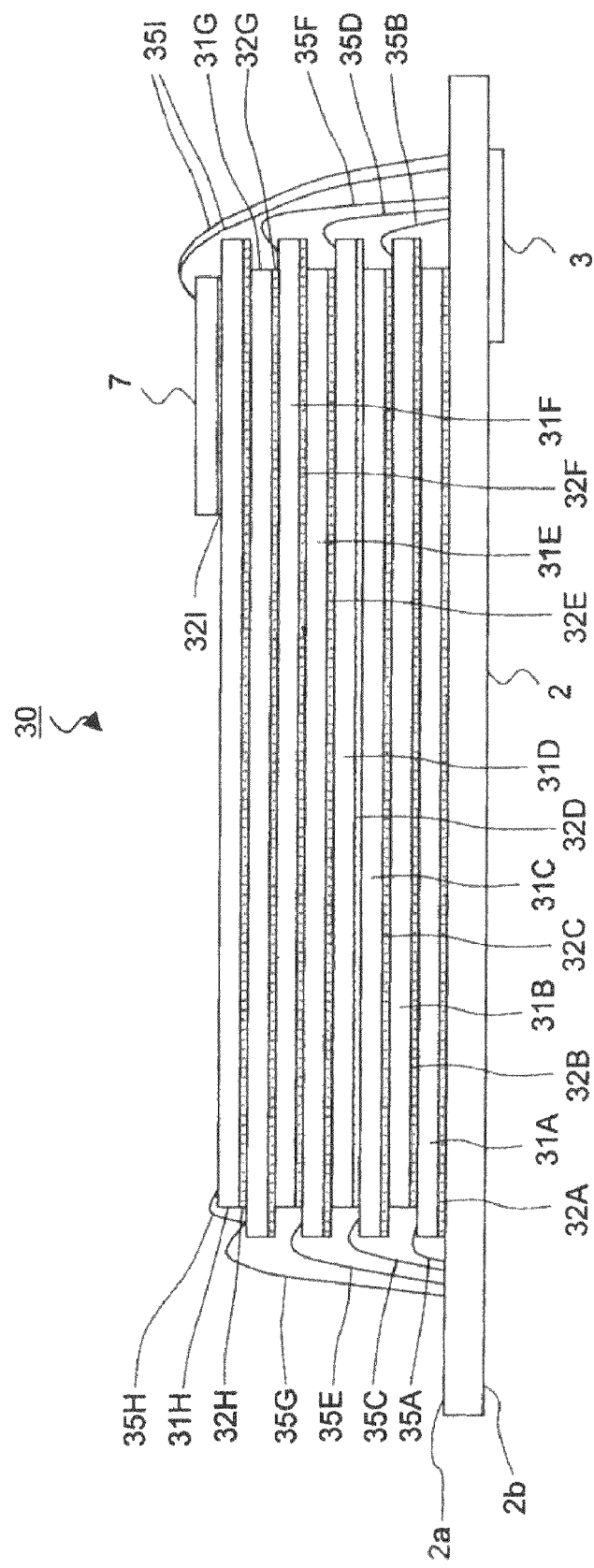
FIG. 6 is a side view diagram along the line A-A' in FIG. 5 of the micro SD™ card related to the third embodiment of the present invention.

The micro SD™ card related to the third embodiment will be explained based on FIG. 5 and FIG. 6. FIG. 5 is a planar view diagram which shows a construction of a micro SD™ card related to the third embodiment of the present invention. FIG. 6 is a side view diagram along the line A-A' in FIG. 3 of the micro SD™ card related to the third embodiment of the present invention. Furthermore, in FIG. 5 and FIG. 6, the same symbols are used for the same structural parts as in the micro SD™ card 1 shown in FIG. 1 and FIG. 2, and thus an explanation of these parts is omitted here.

A device mounting part 4 and connection pads 33 which become the bonding parts at the time of wire bonding are formed on the first main side 2a of the wiring substrate 2. Furthermore, the first main side 2a of the wiring substrate 2 is equivalent to the back side of the micro SD™ card 1. The connection pads 33 are electrically connected with the external connection terminal 3 via internal wiring (through holes etc) which are not shown in the diagram. The connection pads 33 are arranged in the pad regions 33A and 33B which are aligned along the two outer longer sides 2C and 2D of the wiring substrate 2, and also arranged in the region 33C which matches the shape of a salient 2F formed below the longer side 2D.

A plurality of NAND memory chips 31A-31H are stacked and mounted on the device mounting part 4 of the first main side 2a of the wiring substrate 2. A controller chip 7 (controller device) is stacked on the NAND memory chip 31H. The controller chip 7 selects the NAND memory chips 31 which perform programming and reading of data among the plurality of NAND memory chips 31A-31H, and performs programming of data to the selected NAND memory chip 31 and reads data stored in the selected NAND memory chip 31.

As is shown in FIG. 6, eight stages of NAND memory chips 31A-31H are stacked in order from the bottom on the first main side 2a of the wiring substrate 2. The NAND memory chip 31A is attached to the device mounting part 4 of the wiring substrate 2 by a die attach film 32A which is arranged on the bottom surface of the NAND memory chip 31A. The NAND memory chips 31B-31H are respectively attached to each upper surface (stacking surface) of the lower NAND memory chips 31A-31G by die attach films 32B-32H. Furthermore, in the third embodiment, the number of stacked NAND memory chips 31 is shown as 8, however, the number of stacked NAND memory chips 31 is not limited to this number.

The die attach films 32A-32H are adhesive films which possess the functions of a dicing tape and bonding agent. A material which uses a resin such as a general polyimide resin, an epoxy resin and acrylic resin as its main component is used in this adhesive layer. The die attach films 32A-32H use a material which has the same rectangular shape as the exterior of the NAND memory chips 31A-31H.

The NAND memory chips 31A-31H have the same rectangular shape and electrode pads 34A-34H are arranged on the upper surface of each chip. In FIG. 5, only the electrode pad 3H which is arranged on the upper surface of the NAND memory chip 31H which is stacked on the uppermost layer, and the electrode pad 34G which is arranged on each upper surface of the NAND memory chip 31G which is stacked on a layer below the uppermost layer, are shown. The other electrode pads 34A-34F are omitted from the diagram. As is shown in FIG. 6, the NAND memory chips 31A-31H are stacked in steps so that each electrode pad 34A-234H protrudes alternately. Furthermore, as is shown in FIG. 5 and FIG. 6, the case is shown where each electrode pad 34A, 34C, 34E, 34G, and 34H of the NAND memory chips 31A, 31C, 31E, 31G and 31H are stacked so they protrude to the left side of the diagram, and each electrode pad 34B, 34D and 34F of the NAND memory chips 31B, 31D and 31F are stacked so they protrude to the right side of the diagram. The NAND memory chips 31A-31H include the same number of electrode pads 34A to 34H. As a result, as stated above, by stacking the NAND memory chips 31A-31H so that each electrode pad 34A-34H protrudes, it is possible to arrange the electrode pads 34A-34H so that they do not interfere with each other by using the left side region and right side region further to the exterior of the device mounting part 4 of the wiring substrate 2.

The electrode pads 34A, 34C, 34E, 34G, 34H of the NAND memory chips 31A, 31C, 31E, 31G, 31H, are arranged in one line along one exterior side (the longer side 31a shown in FIG. 5) of the NAND memory chip 31H. The electrode pads 34B, 34D, 34F of the NAND memory chips 31B, 31D, 31F, are arranged in one line along one exterior side (the longer side 31b shown in FIG. 5) of the NAND memory chip 31H.

In addition, the electrode pads 34B, 34D, 34F are arranged parallel to an arrangement position of the pad region 33A of the connection pads 33 which are arranged on the first main side 2a of the wiring substrate 2. The electrode pads 34A, 34C, 34E, 34G are arranged parallel to an arrangement position of the pad region 33B of the connection pads 33 which are arranged on the first main side 2a of the wiring substrate 2. Furthermore, in the third embodiment, each side of the NAND memory chips 31A-31H in which the electrode pads 34A-34H are arranged are called pad arrangement sides.

The controller chip 7 is attached to the top surface of the NAND memory chip 31H by the die attach film 32I. The die attach film 32I has the same rectangular shape as the exterior shape of the controller chip 7. The controller chip 7 is arranged with electrode pads 11 on its top surface. The electrode pads 11 are arranged along one exterior side (longer side shown in FIG. 5) of the controller chip 7. In addition, the electrode pads 11 are directly connected to the connection pads 33 of the wiring substrate 2.

The connection pads 33 of the wiring substrate 2 are arranged along two exterior sides (longer sides 2C, 2D shown in FIG. 5) of the first main side 2a. The connection pads 33 of the wiring substrate 2 which are connected with the electrode pads 11 of the controller chip 7 are arranged in an arc shape in the pad region 33C which is matched with shape of the salient 2G of the wiring substrate 2. In addition, the connection pads 33 which are directly connected with the electrode pads 32A, 34C, 34E, 34G of the NAND memory chips 31A, 31C, 31E, 31G are arranged along one exterior side (longer side 2C shown in FIG. 5) of the first main side 2a.

As is shown in FIG. 5, the electrode pads 34G, 34H of the NAND memory chips 31G, 31H are electrically connected with the connection pads 33 of the wiring substrate 2 via bonding wires 35G, 35H (first metallic wire). In addition, the electrode pad 34AF of the NAND memory chip 31F is electrically connected with the connection pad 33 of the wiring substrate 2 by a bonding wire 35F. The dotted line shown in FIG. 5 shows another exterior area of the stacked NAND memory chips 31A, 31C, 31E and 31G. Furthermore, in FIG. 5, the electrode pad 34F and the bonding wire 35F of the NAND memory chip 31F is shown, however, because the NAND memory chip 31F is stacked below the NAND memory chip 31G, it is actually hidden and can not be seen. As is shown in FIG. 6, the electrode pads 34A, 34C and 34E of the NAND memory chips 31A, 31C and 31E are electrically connected with the connection pad 33 of the wiring substrate 2 by bonding wires 35A, 35C and 35E (first metallic wires). In addition, as is shown in FIG. 6, the electrode pads 34B, 34D, 34F of the NAND memory chips 31B, 31D, 31F are electrically connected with the connection pads 33 of the wiring substrate 2 via the bonding wire 35B, 35D, 35F (first metallic wire).

The electrodes 11 of the controller chip 7 are electrically connected with the connection pads 33 of the wiring substrate 2 via the bonding wire 35I (third metallic wire).

In addition, chip parts 41-43 (resistors, condensers etc) are arranged along one exterior side (shorter side 2B shown in FIG. 5) on the first main side of the wiring substrate 2. The chip parts 44, 45 (resistors, condensers etc) are arranged on a constriction part 2F and salient 2G. These chip parts 41-45 are arranged in a region apart from the device mounting part 4 and the pad regions 33A-33C on the first main side 2a of the wiring substrate 2.

As stated above, a plurality of NAND memory chips 31A-31H which include the same number of electrode pads 34A-34H arranged in a line along the longer side 2C, 2D of the wiring substrate 2 are arranged in the micro SD™ card 30 shown in FIG. 5. In addition, the plurality of memory chips 31A, 31C, 31E, 31G, 31H (first device group), are stacked on the device mounting part 4 of the first main side 2a of the wiring substrate 2 so that the arrangement sides (pad arrangement sides) of the electrode pads 34A, 34C, 34E, 34G face the same direction. Furthermore, because the NAND memory chips 31A-31H which include the same number of electrode pads 34A-34H, are arranged so that each electrode pads 34A-34H alternately protrudes to the left side area and right side area further to the exterior than the device mounting part 4 of the wiring substrate 2, the electrode pads 34A-34H can be arranged so that they do not interfere with each other. The controller chip 7 is stacked on the stacking surface of the NAND memory chip 34H. The controller chip 7 includes the electrode pads 11 which are arranged in a line along one exterior side (longer side shown in FIG. 5) of the controller chip 7. In addition, the connections pads 33 which are connected with the electrode pads 11 of the controller chip 7 are arranged in an arc shape in the pad region 33C which matches the shape of the salient 2G of the wiring substrate 2. The electrode pads 11 and the connection pads 33 of the pad area 33C are connected via the bonding wire 35I.

In addition, the plurality of NAND memory chips 31B, 31D, 31F (second device group) are stacked on the device mounting part 4 of the first main side 2a of the wiring substrate 2 so that the arrangement sides (pad arrangement sides) of the electrode pads 34B, 34D, 34F face the same direction. Furthermore, the NAND memory chips 31A, 31C, 31E, 31G, 31H (first device group) and the NAND memory chips 31B, 31D, 31F (second device group) are stacked in steps so that each electrode pad 34A-34H protrude alternately.

Furthermore, the die attach films 32A-32G are stacked on the stacking surface of each NAND memory chip 31A-31G respectively between the NAND memory chips 31A-31H. The die attach films 32A-32G have the same rectangular shape as the exterior shape of the NAND memory chips 31A-31H. As a result, because the hollow films 9A-9G are not used as in the micro SD™ card 1 shown in the first embodiment, the upper NAND memory chips can not be stacked on each other on the parts of the electrode pads 34A-34G and it is necessary to slightly adjust the stacking position of the NAND memory chips in a horizontal direction.

In addition, because the NAND memory chips 31A-31H are stacked so that the electrode pads 34A-34H parts protrude, it is necessary to arrange the electrode pads 34A-34H along each longer side 31a, 31b of the NAND memory chips 31A-31H. As a result, the size of the NAND memory chips 31A-31H is restricted by the electrode pads 34A-34H which are arranged further inwards than the parts arrangement limit position 37 shown in FIG. 5. That is, the size of the NAND memory chips 31A-31H becomes smaller than the size of the NAND memory chips 6A-6H mounted on the micro SD™ card 1 shown in the first embodiment.

However, the electrode pads 34G, 34H of adjacent NAND memory chips 31G, 31H are connected via the bonding wire 35H, and the electrode pads 34A, 34C, 34E, 34G of the NAND memory chips 31A, 31C, 31E, 31G are connected to the connection pads 33 on the wiring substrate 2 via the bonding wires 35A, 35C, 35E, 35G. In addition, the electrode pads 34B, 34D, 34F of the NAND memory chips 31B, 31D, 31F are connected to the connection pads 33 on the wiring substrate 2 via the bonding wires 35B, 35D, 35F. As a result, even if there are many NAND memory chip layers, it is not necessary to expand the pad regions 33A, 33B on the wiring substrate 2. Therefore, while the size of the mountable NAND memory chip of the micro SD™ card 30 shown in the third embodiment is smaller than the micro SD™ card 1 shown in the first embodiment, because it is was made unnecessary to stack the hollow films by adjusting the arrangement of a pad for bonding, it is possible to easily increase the number of stacked layers of NAND memory chips. As a result, it becomes possible to further increase the capacity of NAND memory chips within the external dimensions (L: 15.0 mm, W: 11.0 mm, T: 1.0 mm) of the micro SD™ card 1.

Furthermore, in the micro SD™ card 30 shown in FIG. 5, chip parts 41-45 (resistors, condensers etc) are arranged in a region apart from the device mounting part 4 and pad regions 33A-33C on the first main side 2a of the wiring substrate 2. As a result, it is not necessary to reduce the size of the device mounting part 4 and the chip parts can be mounted.

Furthermore, the present invention was applied to a micro SD™ card in the third embodiment. However, the present invention is not limited to this. The present invention can be applied to various semiconductor memory apparatus which include a plurality of mounted and stacked semiconductor memory devices on a wiring substrate.

What is claimed is:

1. A semiconductor memory apparatus comprising:
   a wiring substrate arranged with a device mounting part and connection pads aligned along one exterior side of said wiring substrate;
   a semiconductor memory device group arranged with a plurality of semiconductor memory devices including electrode pads which are arranged along one external side of said wiring substrate, said plurality of semiconductor memory devices being stacked on said device mounting part of said wiring substrate so that pad arrangement sides all face in the same direction;
   a controller device including electrode pads arranged along at least one external side of said wiring substrate, and stacked on said semiconductor memory device group;
   a first metallic wire which electrically connects said electrode pads of said plurality of semiconductor memory devices with said connection pads of said wiring substrate;
   a second metallic wire which electrically connects said electrode pads of said controller device with said connection pads of said wiring substrate, and
   a third metallic wire which electrically connects said electrode pads of said plurality of semiconductor memory devices with said electrode pads of said controller device;
   wherein
   said electrode pads of said plurality of semiconductor memory devices and said electrode pads of said controller device are arranged parallel to an arrangement position of said connection pads of said wiring substrate.

2. The semiconductor memory apparatus according to claim 1, wherein hollow films having the same shape as said plurality of semiconductor memory devices are stacked on a stacking surface of said plurality of semiconductor memory devices and between said plurality of semiconductor memory devices.

3. The semiconductor memory apparatus according to claim 1, wherein said semiconductor memory device group is stacked in a vertical direction so that each side on which said electrode pads of said plurality of semiconductor memory devices are arranged are aligned.

4. The semiconductor memory apparatus according to claim 1, wherein said connection pads which are connected with said electrode pads of said plurality of semiconductor memory devices and said connection pads which are connected with said electrode pads of said controller device are arranged to the exterior of a notch part and a constriction part of said wiring substrate.

5. The semiconductor memory apparatus according to claim 1, wherein said plurality of semiconductor memory devices have the largest exterior shape within a parts arrangement limit position on said device mounting part of said wiring substrate.

6. A semiconductor memory apparatus comprising:
   a wiring substrate arranged with a device mounting part and connection pads aligned along at least two exterior sides of said wiring substrate;
   a first device group arranged with a plurality of semiconductor devices which include electrode pads aligned along one external side of said wiring substrate, said plurality of semiconductor devices being stacked on said device mounting part of said wiring substrate so that pad arrangement sides all face in the same direction;
   a second device group arranged with a plurality of semiconductor devices which include electrode pads aligned along the other external side of said wiring substrate, said plurality of semiconductor devices being stacked on said device mounting part of said wiring substrate so that pad arrangement sides all face in the same direction;
   a controller device including electrode pads arranged along at least one external side of said wiring substrate, said controller device being stacked on said second device group;
   a first metallic wire which electrically connects said electrode pads of said plurality of semiconductor memory devices which includes said first device group, with said connection pads of said wiring substrate;
   a second metallic wire which electrically connects said electrode pads of said plurality of semiconductor memory devices which includes said second device group, with said connection pads of said wiring substrate, and;
   a third metallic wire which electrically connects said electrode pads of said controller device with said connection pads of said wiring substrate;
   wherein
   said plurality of semiconductor memory devices which includes said first device group and said plurality of semiconductor memory devices which includes said second device group are alternately stacked so that said electrode pads alternately protrude, and said electrode pads of said plurality of semiconductor memory devices and said electrode pads of said controller device are arranged parallel to an arrangement position of said connection pads of said wiring substrate.

7. The semiconductor memory apparatus according to claim 6, wherein adhesive films having the same shape as the external shape of said plurality of semiconductor memory devices are stacked on a stacking surface of said plurality of semiconductor memory devices and between said plurality of semiconductor memory devices.

8. The semiconductor memory apparatus according to claim 6, wherein said connection pads which are connected with said electrode pads of said plurality of semiconductor memory devices which includes said first device group and said connection pads which are connected with said electrode pads of said controller device are arranged to the exterior of a notch part and a constriction part of said wiring substrate.

9. The semiconductor memory apparatus according to claim 6, further comprising a fourth metallic wire which electrically connects said electrode pads of adjacent semiconductor memory device among said plurality of semiconductor memory devices which comprise said first device group, and electrically connects said electrode pads of adjacent semiconductor memory device among said plurality of semiconductor memory devices which comprise said second device group.

10. The semiconductor memory apparatus according to claim 6, wherein a salient is formed on one part of one exterior of said wiring substrate, and said controller device is stacked on said second device group according to a formation position of said salient of said wiring substrate, said connection pads of said wiring substrate which are connected with said electrode pads of said controller device being arranged on said salient.

11. The semiconductor memory apparatus according to claim 10, wherein said connection pads of said wiring substrate which are connected with said electrode pads of said controller device are arranged according to the shape of said salient.

12. The semiconductor memory apparatus according to claim 6, wherein a plurality of chip parts are arranged in a region apart from a region in which said first device group and said second device group are mounted and a region in which said connection pads are arranged.

* * * * *